United States Patent [19]

May

[11] Patent Number: 5,003,278
[45] Date of Patent: Mar. 26, 1991

[54] FERRITE SUPPRESSOR CASE WITH RETAINING FINGERS

[75] Inventor: James P. May, Scranton, Pa.

[73] Assignee: FerriShield, Inc., New York, N.Y.

[21] Appl. No.: 486,760

[22] Filed: Mar. 1, 1990

[51] Int. Cl.⁵ .................. H01F 27/02; H01F 27/26
[52] U.S. Cl. .......................................... 336/92; 174/92;
    324/127; 333/12; 336/175; 336/176; 336/212
[58] Field of Search ...................... 174/92, 50, 52.1;
    220/4 B; 324/127; 333/81 R, 12, 182, 183, 243;
    336/175, 176, 212, 92, 210, 90

[56] References Cited

U.S. PATENT DOCUMENTS 3,183,302  5/1965  Wochner et al. ................. 174/92
3,484,541  12/1969  Campbell ........................ 174/92

FOREIGN PATENT DOCUMENTS 257179  3/1988  European Pat. Off. ............ 336/175

Primary Examiner—Thomas J. Kozma
Attorney, Agent, or Firm—Notaro & Michalos

[57] ABSTRACT

A high frequency noise suppressor for engagement around a cable comprises a pair of case halves made of nylon or other rugged synthetic material which can be snapped around a cable in clam shell like fashion. A ferrite core half is positioned in each case half for defining a ferrite core member around the cable. Each case half has opposite end walls with semicircular recesses. A plurality of triangular fingers extend into each recess and are positioned at a slight angle outwardly with respect to an interior of each case half. The fingers have truncated apexes for defining a small opening in each recess. If a cable which is larger than the small opening is to be engaged by the suppressor, the fingers bend outwardly on opposite sides of the case for firmly engaging the cable. This resists relative movement between the closed case and the cable in either direction along the cable.

19 Claims, 2 Drawing Sheets

FERRITE SUPPRESSOR CASE WITH RETAINING FINGERS

FIELD AND BACKGROUND OF THE INVENTION

The present invention relates in general to ferrite shields for suppressing high frequency noise to and from cables and, in particular, to a new and useful ferrite suppressor case which includes fingers that engage a cable to be shielded, for firmly positioning the shield along the cable.

Ferrite suppressors are manufactured in geometries which use about one cubic inch of ferrous oxide material cast into various cylindrical or rectangular shapes. A hole is provided in the suppressor through which a cable or wire can pass. The cables which use this type of product are data transmission electronic circuits, usually processing frequencies from computer sources. Such a wire or cable can act as an antenna by either receiving or transmitting other unwanted frequencies.

Certain Federal Communications Commission (FCC) regulations require suppression or elimination of these unwanted frequencies. Also, many computer devices require the same type of suppression to enhance overall system performance. Ferrite shields installed on the cable suppress the higher, unwanted frequency signals while permitting the lower data frequencies to pass unaltered. Thus, the undesirable "antenna characteristic" of a cable is controlled.

An advancement to the original solid ferrite designs has been to split it in half, or bisect it. This allows the two halves to be jointed over the wire. A coarse and unsophisticated method of holding the halves together has been to simply tape or wrap them with a wire wrap tie.

U.S. Pat. No. 3,003,084 to Wilkinson discloses a grommet construction for passing cables having different diameters. The grommet is described as having a plurality of separate sectors which each taper downwardly to an apex so that a cable passing through the opening of the grommet tends to bend the thinner portion of the grommet. Thus, despite the diameter of the conductor, the grommet effectively isolates an enclosure to which the grommet is connected.

U.S. Pat. Nos. 3,223,776 to Piasecki and 3,278,674 to Matthysee et al. show junction enclosing cases having slot shaped openings with a plurality of projections or comb like tines closely engage multiple conductors extending through the case, regardless of the diameters of the conductors.

U.S. Pat. No. 3,846,725 to Mears, Jr. discloses a case for enclosing an FM coil which has semicircular openings at opposite ends thereof with a plurality f outwardly included flexible projections for closely engaging a coil to be held in the case.

None of the foregoing prior art patents mentions the use of a ferrite core for engagement around a conductor.

U.S. Pat. No. 4,825,185 to Matsui shows a split ferrite core that is held in two halves of a case for snapping closed around a conductor to achieve a shielding function. Also see U.S. Pat. No. 3,924,223 to Whyte et al. which shows ferrite core halves for shielding a wire.

SUMMARY OF THE INVENTION

The present invention comprises a snap case having two halves which are hinged to each other, each containing half of a ferrite core. Each half has a pair of semicircular recesses at opposite ends thereof, with triangular fingers having bases attached to the respective case halves. Each projection extends into the recess to partially close it. In use, the case is closed around a conductor which passes through opposite ports formed by the semicircular recesses. The ferrite core absorbs radio frequency noise to shield the conductor.

To accommodate conductors of different diameters, the triangular fingers bend outwardly in opposite directions from the opposite sides of the case and closely engage around the conductor. To provide additional flexibility for the triangular fingers, a bend line separates each finger from its respective case half. The two case halves and the fingers are formed as one or multiple pieces of nylon or other rugged flexible synthetic material and the triangular fingers are formed so that they extend at a slight angle outwardly from the interior of the case before the case is used on a conductor. A snap connection is provided between the case halves for holding the case in a closed position around a conductor.

By extending the fingers in opposite incline directions, on opposite sides of the case, movement of the case in either direction along the cable is precluded.

Other features of the present invention include the use of different sized and/or positioned fingers in each semicircular recess for engaging a cable at slightly different axial locations along its length when the case is snapped onto the cable. This simplifies casting the case as one piece and spreads the pressure on the cable over a slightly larger area to avoid puncturing the insulation of the cable.

In one embodiment of the invention, the floors of the case halves are provided with a plurality of relieved spring tabs which push ferrite core halves that are engaged in the respective case halves, toward the cable. The spring tabs cooperate with detents formed integrally with the case halves to firmly retain the core halves in the case halves while allowing them to float.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which preferred embodiments of the invention are illustrated.

DESCRIPTION OF THE PREFERRED EMBODIMENTS

Figure 1:
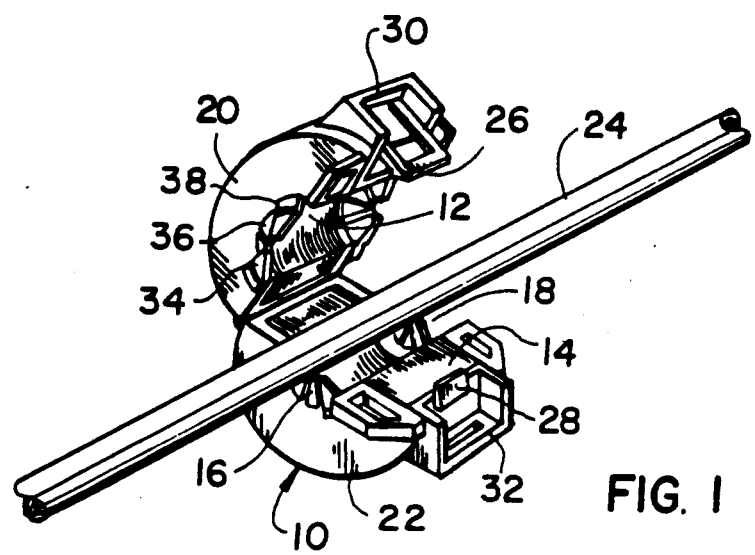
FIG. 1 is a perspective view of one embodiment of the invention having a cylindrical configuration and shown in an open position about to be engaged unto a cable.

According to the present invention, the two halves 12 and 14 of a ferrite core are installed in a "clam shell" style plastic case 10 as shown in FIG. 1. This has many advantages including ease of installation, the use of an insulated casing, and integral mounting clamp in some cases, and cost-effective assembly with regard to savings of time in a manufacturing or service environment.

Figure 2:
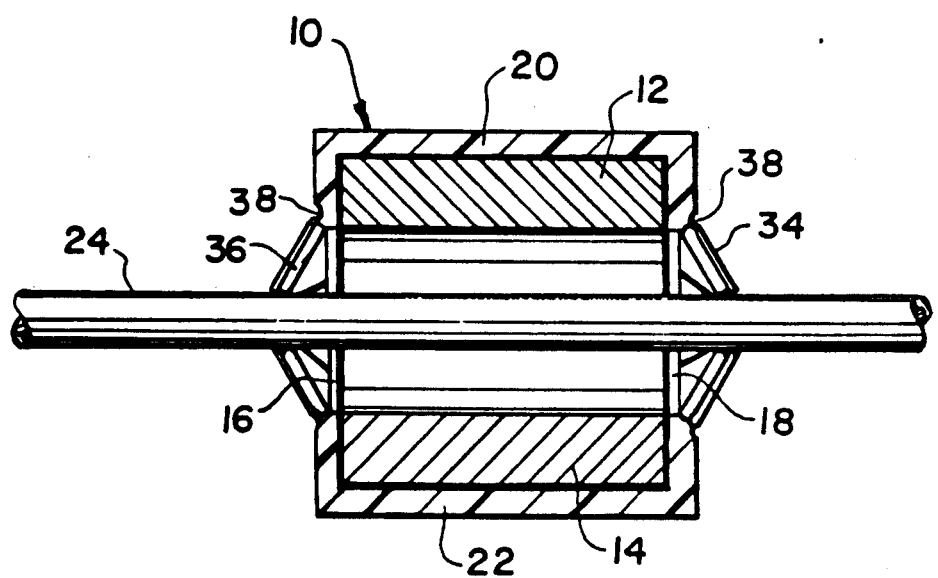
FIG. 2 sectional view of the ferrite case of FIG. 1, showing fully engaged on a cable.

The plastic case 10 has two end openings, or ports 16 and 18, formed by semicircular recesses in end walls of the case halves 20 and 22. A cable 24 enters one opening and leaves the other opening as shown in FIG. 2. If the diameter of the cable is about the same diameter as the end port opening, a tight, snug fit occurs. In most cases, this is desirable since the integrity of the ferrite performance is related to its ability to stay tightly positioned on the end of the wire where it enters or exits a computer or peripheral piece of equipment. When the diameter of the wire is less than the diameter of the end port opening, the ferrite assembly will slip out of position.

In order to prevent this, the cable may be "doubled-looped" through the hole in the ferrite, or an outside wire-wrap may be installed. Both methods are unacceptable packaging practices, however, as well as labor intensive and expensive.

The present invention provides a structure wherein even a greatly smaller sized diameter wire is held by a set of expandable fingers 34 and 36 which surround the entry/exit ports 16, 18 and keep constant pressure on the cable 24.

The invention has the following advantages:

a snug fit of the ferrite assembly with no slipping;

a cleaner packaging method which is improved over tying the case into position or looping the wire;

one size case fits many sizes of cables requiring only a few sizes of cases with fingers to serve the entire range of data cable sizes;

a less costly method of attaching the case to the cable;

assured integrity of electronic performance for the installed ferrite suppressor; and higher performance in a vibrating or shaking environment due to the gripping ability of the fingers.

In the embodiment of FIGS. 1 and 2, each semicircular recess at each end of each case half, contains four fingers 34, 36. The inner two fingers 36 of each semicircular recess are smaller than the outer fingers 34 of that recess. In this way, the larger fingers 34 have a longer reach and engage at a different axial position on the cable 24 then the smaller inner fingers 36, as shown in FIG. 2. Slots separate each of the fingers in each semicircular recess. A bend line 38 separates each finger from the remainder of the case half so that the generally triangular fingers stay relatively plainer even when they are bent outwardly by virtue of their engagement with the cable.

As best shown in FIG. 2, the fingers bend outwardly in opposite directions at the opposite ends of the case 10. This precludes axial movement of the case in either direction along the cable 24 as the fingers at each end resist movement along the cable in opposite directions by digging into the cable insulation when external forces try to move the case in that direction.

By utilizing fingers 34 and 36 of different sizes which engage the cable insulation at different axial locations, the tendency of the fingers to cut into and possibly damage the insulation is avoided. The axial distribution of the pressure points between the fingers and the insulation avoid a build-up of local force which may damage the insulation.

In the embodiment of FIGS. 1 and 2, fingers 34 and 36 are molded or machined integrally as one piece with the rest of the case. A flexible hinge which is also made as one piece with the rest of the case connects the case halves 20 and 22. With different sizes and/or positions for fingers 34 and 36 it also becomes easier to cast the case as one piece.

The case 10 is advantageously made of nylon or other strong resilient synthetic material.

In order to snap the case halves together, each case half carries a latch on a side opposite from the hinge. As shown in FIG. 1, a female latch tab 26 extends from the outer edge of the upper case half 20. The relatively thin and delicate tab 26 is protected by the walls of a protective housing 30 extending partly around tab 26.

A male tab 28 which is shaped to be received within the recess of female tab 26, is connected to and projects upwardly from the outer edge of lower case half 22. Tab 28 is also protected by the walls of a protective housing 32. When case 10 is closed and tab 28 is engaged within the recess of tab 26, the walls of housings 30 and 32 engage each other to form a peripheral protective barrier area around the tabs. This both protects the tabs and avoids accidental unlatching of the tabs. The tabs may be unlatched by inserting the blade of a small screw driver into a slot formed in the lower wall of housing 32, to lift female tab 26 from male tab 28 and allow the case to be opened.

The lower wall may have no slot in order to prevent any opening of the case after it is installed. For the same reason, an outer wall (not shown) may be used on the housing 32 to close all access to the tabs. A further alteration in the latch is to use a male latch on upper case halve 20 which is in the shape of an arrowhead, and which is forced into the slot in lower housing 32. This would effect a latching which cannot be reopened without destroying the case, to satisfy certain requirement such as military specifications.

Figure 3:
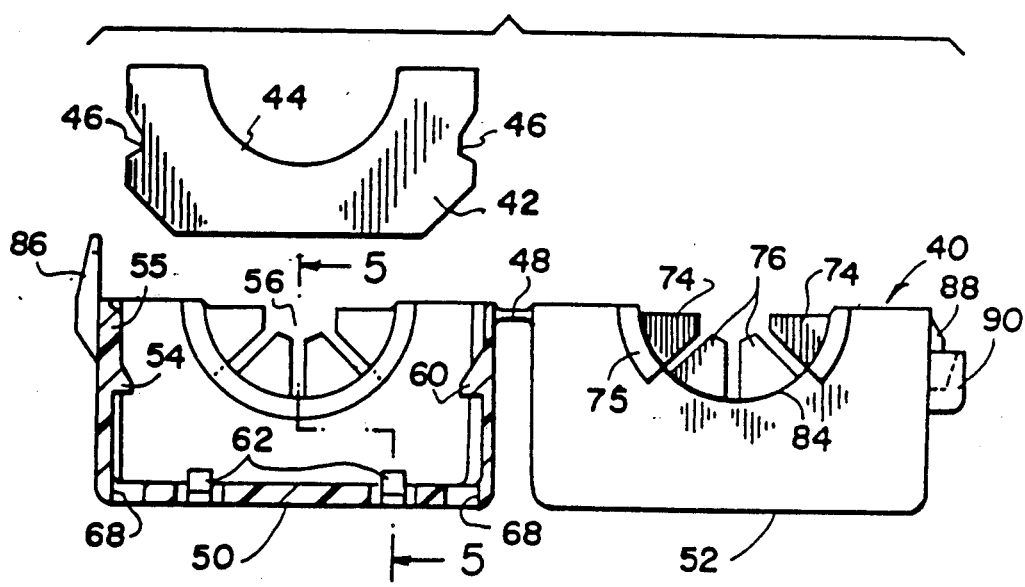
FIG. 3 is an exploded end view of a ferrite case according to another embodiment of the invention, shown partially in section and taken along line 3—3 of FIG. 4.
Figure 4:
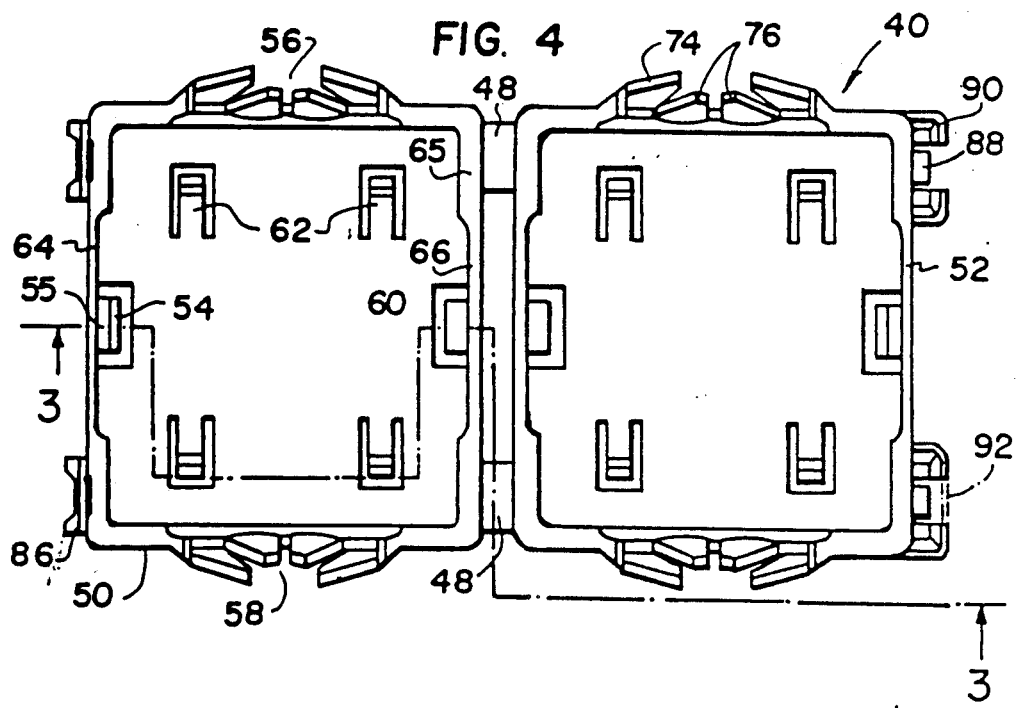
FIG. 4 is a top plan view of the embodiment of FIG. 3 with both of the ferrite core halves removed.
Figure 5:
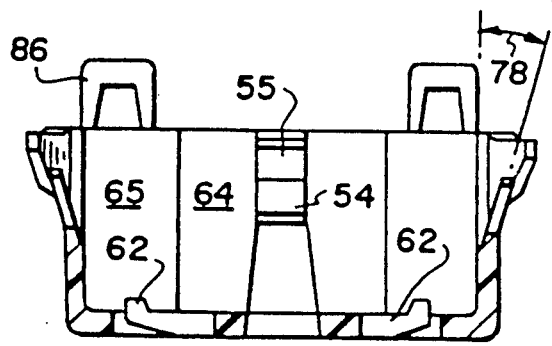
FIG. 5 is a sectional view taken along line 5—5 of FIG. 3.

FIGS. 3 through 5 show an alternate embodiment of the invention which has a rectangular configuration.

The one piece nylon case generally designated 40 comprises a first half 50 which is connected at a pair of nylon hinges 48 to a second case half 52. Each case half receives a generally rectangular core half 42 having a semicircular recess 44 of a diameter which is at least as great as the diameter of the semicircular ports 56 and 58 in the end walls of each case half. A groove 46 is provided in each side wall of core half 42 for engagement unto a pair detents 54 and 60 extending inwardly from opposite side walls of each of the case halves. The case half 50 at the left in FIG. 3 is shown in section to reveal detents 54, 60.

Four relieved spring tabs 62 have tips which extend upwardly from the inner plane of the floor of each case half 50 and 52. Spring tabs 62 resiliently engaged against the bottom surface of the core half 42 to urge the core half upwardly. This upward movement is restrained by the detents 54 and 60 to provide a floating suspension for the core halves in the case halves.

In order to install core half 42 into case half 50, the side walls of the case half must spread slightly. To this end, each side wall has a thin walled section 64 and 66 which respectively carry the detents 54 and 60. Side to side shifting of the core halves in the case halves is resisted by providing each of the detents 54 with an upper thick portion 55 which engages the side of the core half when the core half is in the case half. Each case half is also provided with thick wall sections 65 for engaging the side walls of the core half when it is seated in the case half. The detents 60 on the opposite side of the core half from detent 54 is wedge shaped.

Each semicircular port of each case half has a pair of outer larger fingers 74 and a pair of smaller inner fingers 76 which are separated by slots from each other. The outer fingers 74 have skirts 75 which engage over the outer surface of the end wall for the respective case half. In this way, the outer fingers extend further outwardly from the interior of the case then the inner fingers 76. All the fingers are preset in a selected angle 78 shown in FIG. 5 which is preferably 15° in an outward direction from either end of the case. This angle may vary however, from 5° to 30°. Smaller angles do not insure that each finger will deflect outwardly from the respective end of the case. A greater angle provides insufficient pressure on the cable to effect positive engagement between the case and the cable to preclude any axial movement of the case along the cable. As shown in the drawings, both the inner and outer surfaces of each finger are inclined outwardly of the case.

The inner fingers 76 extends inwardly from the inner periphery of each semicircular recess.

While the fingers 74, 76 are generally triangular, as best shown in FIG. 3, each finger has a truncated apex so that even with the fingers in their preset undeformed positions as they are represented in FIGS. 3 through 5, an opening remains near the center of the semicircular port. The opening is selected to be at least slightly smaller than the smallest diameter cable to be serviced by the case. Since no cable smaller than this diameter is meant for use with the case, the presence of pointed apexes for each triangular finger would be counter-productive and would reduce the usefullness of the case for larger diameter cables which approach the diameter of the semicircular port. The preset angle between each finger and a respective end wall defines a curved bend line 84 which facilitates bending of the fingers at a desired location, namely at the bend line, when a large diameter cable is engaged by the case.

Slots 68 are provided under each detent 54 and 60 to allow insertion of a screw driver to deform the thin wall sections 64 and 66 for the purpose of withdrawing a core half if desired.

Case half 50 has a side wall which is opposite from hinges 48 that carries a pair of female tabs 86. An aperture on each female tab 86 is shaped to receive a male tab 88 on a side wall of case half 52 which is opposite from hinges 48. A housing 90 partially engages around the male tab 88 to partially cover and protect the latch when the female tab is engaged on the male tab. As shown by phantom line at 92 in FIG. 4, the housing may be outwardly closed, leaving only an upper opening to receive the female tab. With housing 90 partially open, a screw driver or other sharp instrument can be used to unlatch and open the case. With a closed housing 92, unlatching becomes impossible. The closed housing is useful where specifications call for a latch which cannot be reopened once closed. An alternate form of the latch is to use tabs which have an arrowhead shape which are engagable into slots having a slightly narrower width so that once the arrowhead tabs are engaged into the slots, they cannot be withdrawn without damaging the case.

While specific embodiments of the invention has been shown and described in detail to illustrate the application of the principles of the invention, it will be understood that the invention may be embodied otherwise without departing from such principles.

What is claimed is:

1. A noise suppressor for engagement over a cable, comprising:
    a first case portion having opposite end walls and at least one side wall;
    a second case portion having opposite end walls and at least one side wall;
    side first and second case portions being engagable with each other into a closed position over a cable;
    each end wall of each case portion having a cable recess therein which, with said case portions in the closed position form ports in the end walls for receiving a cable therethrough;
    a plurality of resilient fingers connected to each end wall of each case and extending into each respective cable recess, each of said fingers having inner and outer surfaces which are both inclined outwardly with respect to an interior of each respective case portion so that movement of said case portions into the closed position engages said fingers onto a cable for engaging the cable and deforming said fingers outwardly with respect to the interior of said case portions to resist relative movement between said case portions and the cable in opposite axial directions along the cable, each of said fingers being substantially triangular with a truncated apex for defining an opening in each port with said case portions in the closed position, at least one finger in each cable recess being at a different position with respect to at least one other finger in said cable recess along an axis extending between said cable recesses of one of said case portions; and
    mounting means in each case portion for retaining a core portion in each case portion.

2. A suppressor according to claim 1, including latch means connected between said side walls of said first and second case portions for latching said case portions to each other in the closed position.

3. A suppressor according to claim 1, wherein the surfaces of said fingers extend into said cable recess at an angle of from 5° to 30° from the interior of each case portion.

4. A suppressor according to claim 3, wherein said mounting means includes at least one spring tab in each of said case portions for engaging a core portion to establish a floated mounting of a core portion in each case portion.

5. A suppressor according to claim 4, wherein said mounting means includes a detent connected to the side wall of each case portion for engagement with a groove in a core portion for each case portion for retaining each core portion in each case portion.

6. A suppressor according to claim 5, including a core portion in each case portion engaged with said spring tab and said detent.

7. A suppressor according to claim 1, wherein at least one finger in each cable recess has a different size than another finger in said cable recess.

8. A suppressor according to claim 1, wherein said first and second case portions comprise first and second case halves, each cable recess having the same number of fingers extending therein.

9. A suppressor according to claim 8, wherein said case halves are rectangular.

10. A suppressor according to claim 9, wherein each rectangular case half has a pair of opposite side walls, one side wall of each case half being connected to the other case half by hinge means and an opposite side wall of each case half carrying at least one latch for maintaining the case halves in the closed position.

11. A suppressor according to claim 10, wherein a latch connected to one of the case halves comprises a female latch and a latch connected to the other of said case halves comprise a male latch for engagement with the female latch.

12. A suppressor according to claim 11, including a housing connected to the opposite side wall of at least one of the case halves for at least partly covering said latches in the closed position of said case halves.

13. A suppressor according to claim 1, including connecting means connected between the side walls of said first and second case portions for connecting said case portions to each other in the closed position.

14. A suppressor according to claim 13, wherein said connecting means comprise hinge means connected between the side walls of said first and second case portions for pivotally connecting said case portions to each other.

15. A suppressor according to claim 1, wherein said fingers of each recess are separated from each other by a slot, a female tab connected to and extending outwardly from the one side wall of said first case portion, said female tab having an opening therein, a male tab positioned on and extending from the one side wall of said second case portion for insertion into the opening of said female tab when the side walls of said first and second case portions are adjacent each other to latch said first and second portions to each other, and a housing connected to the one side wall of said second case portions and at least partly surrounding said male tab and said female tab when said male tab is inserted in the opening of said female tab for restricting disconnection of said male tab from said female tab.

16. A suppressor according to claim 15, wherein said at least one finger in each cable recess is positioned axially outwardly of the at least one other finger, and including a skirt connected between said at least one finger and said end wall.

17. A suppressor according to claim 16, including four fingers in each cable recess, two of said fingers in each recess being adjacent each other and being positioned axially closer to the interior of said case portion than a remaining two fingers in each cable recess.

18. A suppressor according to claim 1, wherein said at least one finger in each cable recess is positioned axially outwardly of the at least one other finger, and including a skirt connected between said at least one finger and said end wall.

19. A suppressor according to claim 18, including four fingers in each cable recess, two of said fingers in each recess being adjacent each other and being positioned axially closer to the interior of said case portion than a remaining two fingers in each cable recess.

* * * * *